(12) United States Patent
Zhong et al.

(10) Patent No.: US 10,340,246 B1
(45) Date of Patent: Jul. 2, 2019

(54) WIRE BALL BONDING IN SEMICONDUCTOR DEVICES

(71) Applicant: TEXAS INSTRUMENTS INCORPORATED, Dallas, TX (US)

(72) Inventors: Han Zhong, Chengdu (CN); Yong Qiang Tang, Chengdu (CN); Chen Xiong, Chengdu Sichuan (CN); Zi Qi Wang, Chengdu Sichuan (CN); Xi Lin Li, Chengdu (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/980,948

(22) Filed: May 16, 2018

Related U.S. Application Data

(63) Continuation of application No. PCT/CN2018/072587, filed on Jan. 15, 2018.

(51) Int. Cl.
*H01L 23/00* (2006.01)
*H01L 21/48* (2006.01)
(Continued)

(52) U.S. Cl.
CPC .......... *H01L 24/48* (2013.01); *H01L 21/4825* (2013.01); *H01L 21/565* (2013.01);
(Continued)

(58) Field of Classification Search
CPC ... H01L 24/48; H01L 21/565; H01L 23/3114; H01L 23/562; H01L 23/49582;
(Continued)

(56) References Cited

U.S. PATENT DOCUMENTS

| 2009/0029542 A1 | 1/2009 | Subido et al. |
| 2016/0126208 A1* | 5/2016 | Lee ........................ H01L 24/45 257/762 |

FOREIGN PATENT DOCUMENTS

| CN | 101405863 A | 4/2009 |
| CN | 101901793 A | 12/2010 |
| CN | 102637613 A | 8/2012 |

OTHER PUBLICATIONS

International Search Report for PCT/CN2018/072587 dated Oct. 18, 2018, pp. 1-5.

* cited by examiner

*Primary Examiner* — Kyoung Lee
(74) *Attorney, Agent, or Firm* — Dawn Jos; Charles A. Brill; Frank D. Cimino

(57) ABSTRACT

A method of interconnecting components of a semiconductor device using wire bonding is presented. The method includes creating a free air ball at a first end of an aluminum wire that has a coating surrounding the aluminum wire, wherein the coating comprises palladium, and wherein the free air ball is substantially free of the coating. The method further includes the step of bonding the free air ball to a bond pad on a semiconductor chip, the bond pad having an aluminum surface layer, wherein the resultant ball bond and the bond pad form a substantially homogenous, aluminum-to-aluminum bond. The method may further include bonding a second, opposing end of the coated-aluminum wire to a bond site separate from the semiconductor chip, the bond site having a palladium surface layer, wherein the second end of the coated-aluminum wire and the bond site form a substantially homogenous, palladium-to-palladium bond.

20 Claims, 5 Drawing Sheets

(51) Int. Cl.
*H01L 23/495* (2006.01)
*H01L 23/31* (2006.01)
*H01L 21/56* (2006.01)

(52) U.S. Cl.
CPC ...... *H01L 23/3114* (2013.01); *H01L 23/4952* (2013.01); *H01L 23/49513* (2013.01); *H01L 23/49582* (2013.01); *H01L 23/562* (2013.01); *H01L 24/05* (2013.01); *H01L 24/45* (2013.01); H01L 2224/04042 (2013.01); H01L 2224/05124 (2013.01); H01L 2224/4502 (2013.01); H01L 2224/45124 (2013.01); H01L 2224/45565 (2013.01); H01L 2224/45647 (2013.01); H01L 2224/45664 (2013.01); H01L 2224/48245 (2013.01); H01L 2224/48465 (2013.01); H01L 2224/48724 (2013.01); H01L 2224/48769 (2013.01); H01L 2924/35121 (2013.01)

(58) Field of Classification Search
CPC ........... H01L 23/4952; H01L 23/49513; H01L 24/45; H01L 24/05; H01L 21/4825; H01L 2224/05124; H01L 2224/48769; H01L 2224/48724; H01L 2224/48465; H01L 2224/48245; H01L 2224/45647; H01L 2224/45664; H01L 2224/45565; H01L 2224/45124; H01L 2224/4502; H01L 2924/35121; H01L 2224/04042
See application file for complete search history.

WIRE BALL BONDING IN SEMICONDUCTOR DEVICES

BACKGROUND

This disclosure relates generally to semiconductor devices, and more particularly to wire ball bonding in semiconductor devices.

In semiconductor packaging, wire bonding is used to electrically couple a semiconductor die to a lead frame or other elements within the semiconductor package. One type of wire bonding is a ball bond. In wire ball bonding, a ball is formed on one end of a metal wire using an electrical flame-off (EFO) wand. The ball is then bonded to a bond pad on the semiconductor die. The other end of the metal wire is then bonded to a lead or bond site on a lead frame or another element within the semiconductor package by way of a second bond (stitch bond). While wire bonding has served the industry well for many decades, improvements are still desired. One area of desired improvement is with aspects of intermetallic bonds.

SUMMARY

In one aspect, a method of interconnecting components of a semiconductor device using wire bonding is presented. The method includes the steps of creating a free air ball at a first end of an aluminum wire that has a coating surrounding the aluminum wire, wherein the coating comprises palladium, and wherein the free air ball is substantially free of the coating. The method further includes the step of bonding the free air ball to a bond pad on a semiconductor chip, the bond pad having an aluminum surface layer, wherein the free air ball forms a ball bond on the bond pad to form a substantially homogenous, aluminum-to-aluminum bond. The method further includes bonding a second, opposing end of the coated-aluminum wire to a bond pad separate from the semiconductor chip, the bond pad having a palladium surface layer, wherein the second end of the coated-aluminum wire and the bond pad form a substantially homogenous, palladium-to-palladium bond.

In another aspect, a semiconductor device includes a lead frame and a semiconductor die having a first side and an opposing, second side. The second side of the die is attached to the lead frame with the semiconductor die having an aluminum bond pad on its first side. A lead is attached to the lead frame adjacent the semiconductor die with the lead having a palladium surface layer. The device further includes a palladium-coated aluminum interconnect wire having a ball bond formed on a first end of the palladium-coated aluminum wire with the free air ball bonded to the aluminum bond pad of the semiconductor die to form a first bond such that the first bond is a substantially homogenous, aluminum-to-aluminum bond, and a second end of the palladium-coated aluminum interconnect wire is bonded to the palladium surface layer of the lead to form a second bond such that the second bond is a substantially homogeneous, palladium-to-palladium bond.

In yet another aspect, a semiconductor device includes a support structure, a semiconductor die attached to the support structure, wherein the semiconductor die has a first bond pad with an aluminum surface layer, and a bond site having a palladium surface layer. The bond site is adjacent to the semiconductor die. The device further includes a coated-aluminum wire for connecting the first bond pad on the semiconductor die to the bond pad on the support structure. The coating over the coated-aluminum includes palladium. The coated-aluminum wire has a first end with a free air ball formed thereon, the free air ball bonded to the first bond pad, wherein, during formation of the ball bond, at least a portion of the coating is removed from the free air ball such that a bond between the ball bond and the first bond pad is at least substantially an aluminum-to-aluminum bond. A second end of the coated-aluminum wire is bonded to the palladium surface layer of the bond site such that a palladium-to-palladium bond is formed.

DETAILED DESCRIPTION

Copper and gold wire are common wire materials used in ball bonding due to their ability to maintain desirable properties despite heat and other factors employed in forming the ball bond. In ball bonding, however, it is common for the wire interconnect to be formed of a different material than the bonding pads to which the wire interconnect is bonded to, thereby creating an intermetallic bond between the wire interconnect and the bond pad. Bonding two different materials together may create bond stresses within the bond site, interface corrosion, intermetallic formation, or other bond degrading conditions. Aspects of these concerns are addressed herein.

Figure 1A:
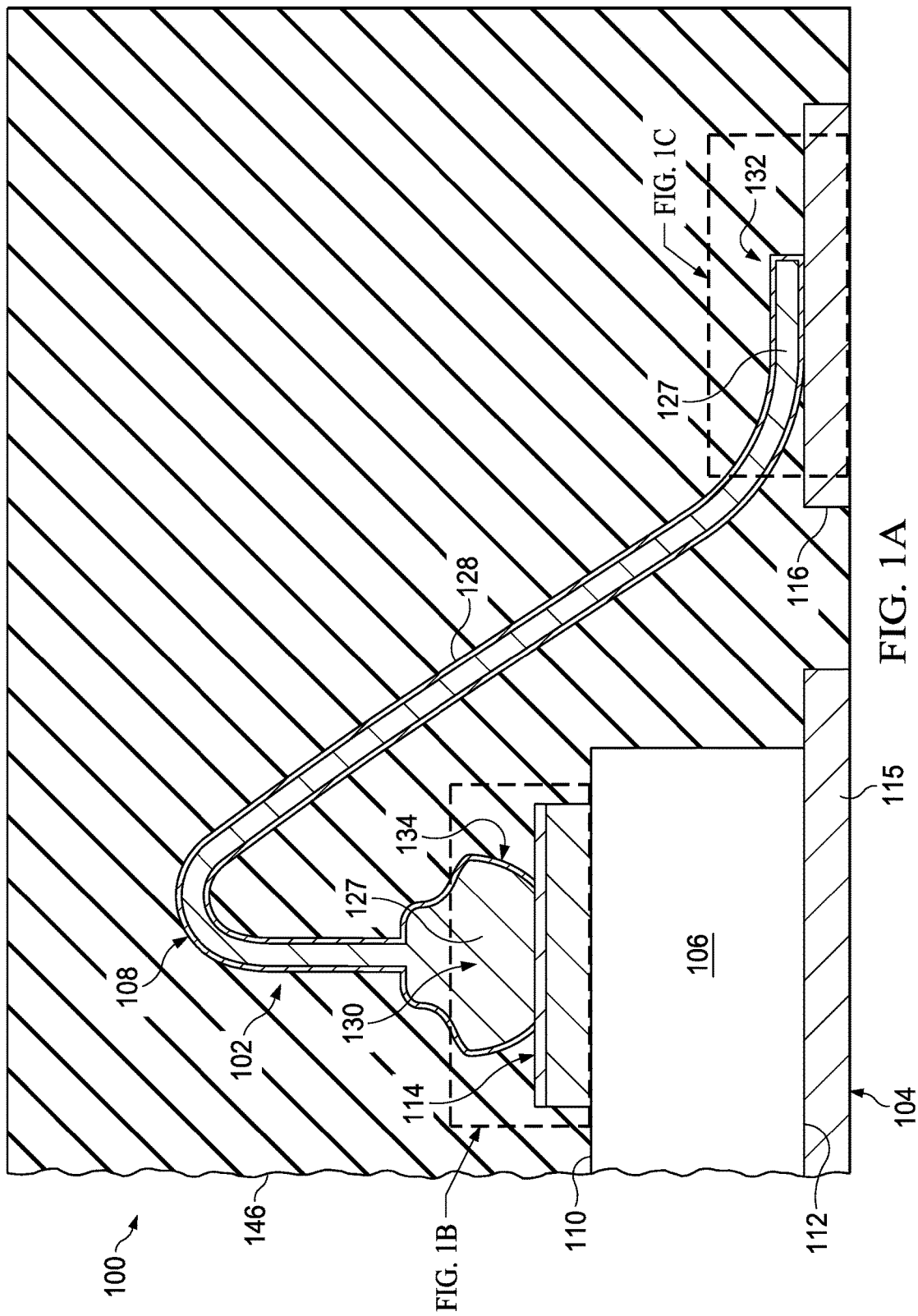
FIG. 1A is a schematic, cross-sectional view of a wire bond in a semiconductor device, according to an illustrative embodiment.
Figure 1B:
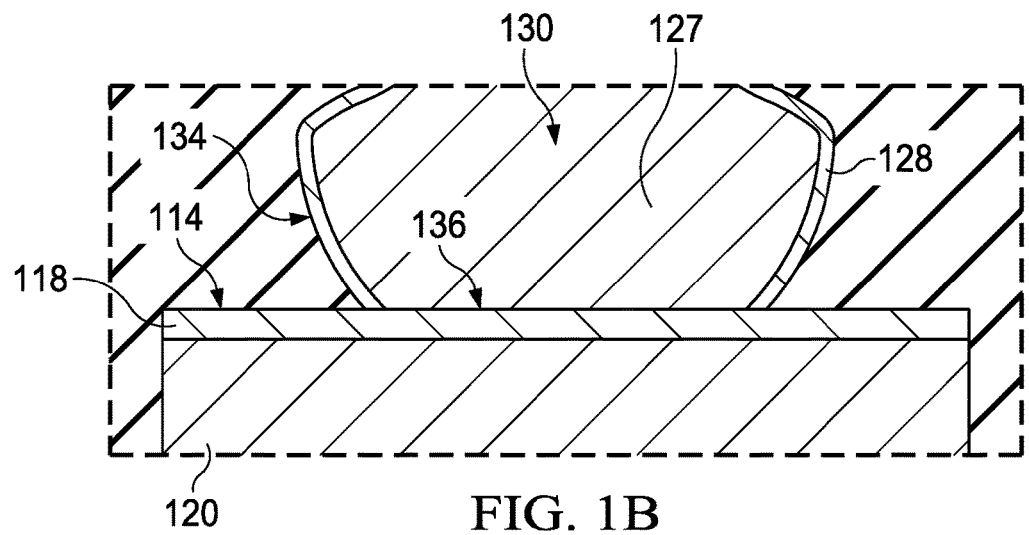
FIG. 1B is a schematic, detailed view of a portion of FIG. 1A.
Figure 1C:
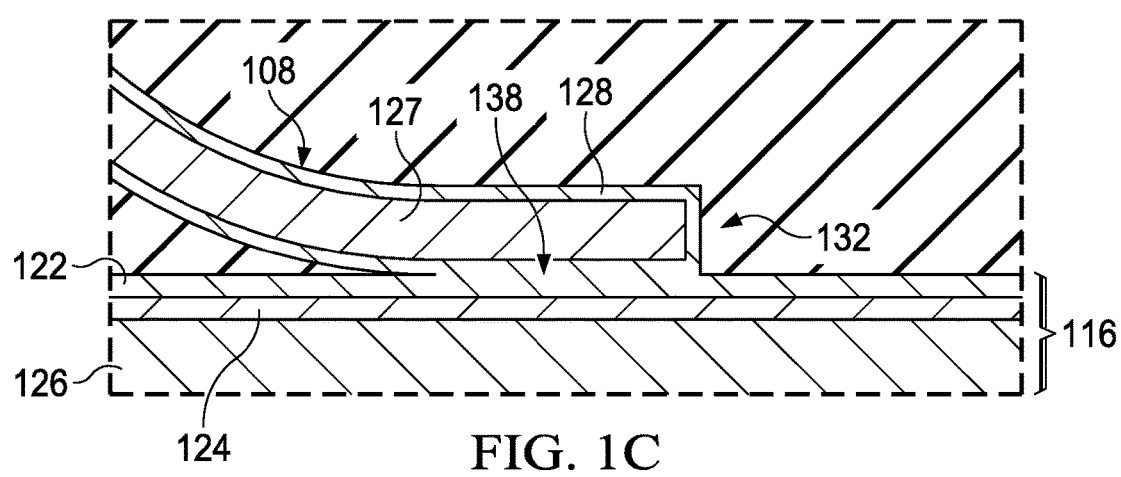
FIG. 1C is a schematic, detailed view of a portion of FIG. 1A.

Referring to FIGS. 1A through 1C, an illustrative embodiment of a semiconductor device 100 using a wire ball bond 102 is presented. The semiconductor device 100 includes a support structure 104, a semiconductor die 106 attached to the support structure 104, and a coated-aluminum wire 108 for providing an interconnect between the semiconductor die 106 and a device external to the semiconductor die 106, such as a bond pad (e.g., a bond site 116 introduced below). The support structure 104, in some illustrative embodiments, may be a semiconductor substrate or lead frame.

The semiconductor die 106 has a first side 110 and an opposing, second side 112, with the second side 112 of the semiconductor die 106 being attached to the support structure 104. The coated-aluminum wire 108 connects a first bond pad 114 on the first side 110 of the semiconductor die 106 to the bond site 116 on the support structure 104 that is external to the semiconductor die 106. The bond site 116 may be on or otherwise a part of the support structure 104. As mentioned above, in some aspects, the support structure 104 may be a lead frame. When the support structure 104 is a lead frame, in some aspects, the semiconductor die 106 may be on a first portion 115 of the lead frame (support structure 104) and the bond site 116 may be a second portion, also referred to as a lead, that is part of the lead frame 104.

The first bond pad 114 includes at least an aluminum surface layer 118. In some aspects, the aluminum surface layer 118 may be an aluminum alloy. The first bond pad 114 may further include a diffusion barrier layer 120 between the aluminum surface layer 118 and the semiconductor die 106. In a nonlimiting, illustrative embodiment, the diffusion barrier layer 120 is titanium nitride (TiN). Other known diffusion barrier layer materials may be used. In other aspects, the first bond pad 114 is formed entirely of aluminum or an aluminum alloy. Aluminum tends to be a cost effective conductive material having desirable properties for at least some bond pads on the semiconductor die.

The bond site 116 includes at least a palladium (Pd) surface layer 122. In some aspects, the bond site 116 is an integral part of the support structure 104. In yet some aspect, the bond site 116 is a lead attached to the support structure 104 or lead frame. In other aspects, the bond site 116 is attached to a surface of the support structure 104 (not explicitly shown). The bond site 116 may further include a nickel (Ni) layer 124 and a copper (Cu) layer 126 beneath the palladium (Pd) layer 122. In yet some aspects, the bond site 116 may include a silver plating. The bond site 116 may include a palladium layer, a copper layer, a nickel layer, a silver layer or a combination thereof.

The coated-aluminum wire 108 includes an aluminum core 127 surrounded by a coating 128 comprising palladium. In some aspects, the coating 128 comprises palladium and copper, such that the coating 128 is a palladium-copper coating. The coating 128 protects the aluminum core 127 from absorbing hydronium ($H^+$), becoming brittle, oxidizing or otherwise degrading during the wire ball bonding process. The coated-aluminum wire 108 has a first end 130 and an opposing, second end 132. The first end 130 of the coated-aluminum wire 108 is bonded to the first bond pad 114 on the semiconductor die 106 and the second end 132 of the coated-aluminum wire 108 is bonded to the bond site 116.

Still referring to FIGS. 1A through 1C, the first end 130 of the coated-aluminum wire 108 has a ball bond 134 formed thereon that is bonded to the first bond pad 114. The ball bond 134 is formed using a free air ball (FAB) 135 (FIG. 2B). During formation of the free air ball 135 and resultant ball bond 134, at least a portion of the coating 128 is removed from the aluminum core 127. The free air ball is formed from the aluminum core 127. In other words, the coating 128 is removed from the aluminum core 127, thereby exposing a portion of the aluminum core 127 so that at least portions of the free air ball, and thus the ball bond 134, are substantially formed of aluminum. A first bond 136, or interface, is formed between the ball bond 134, which is now substantially formed from aluminum, and the aluminum surface layer 118 of the first bond pad 114. The first bond 136 is a substantially homogeneous, aluminum-to-aluminum bond. While the first bond 136 is a substantially homogeneous, aluminum-to aluminum bond, other suitable metals may be used to form the first bond pad 114 and the core 127 so long as the metals are similar enough to form a substantially homogeneous bond. The process of removing the coating 128 and forming the free air ball and its subsequent ball bond 134 will be discussed in more detail below with regards to FIGS. 2A through 2C.

The second end 132 of the coated-aluminum wire 108 is bonded to the palladium surface layer 122 of the bond site 116 to form a second bond 138. The palladium coating 128, which surrounds the coated-aluminum wire 108, remains intact when the second bond 138 is formed, such that the second bond 138 is a substantially homogeneous, palladium-to-palladium bond. In some aspects, the second bond 138 is a stitch bond, where atom diffusion occurs. In yet other aspects, the second bond 138 is a wedge bond. While the second bond 138 is a substantially homogeneous, palladium-to-palladium bond, other suitable metals may be used to form or at the bond site 116 and the coating 128 so long as the metals are similar enough to form a substantially homogeneous bond.

The semiconductor device 100 may further include a molding compound 146. The molding compound 146 may cover at least a portion of the semiconductor die 106, the coated-aluminum wire 108, the first bond 136 and the second bond 138. The molding compound 146 may be any suitable insulating material.

The semiconductor device 100, provides the coated-aluminum wire 108 that allows for the first bond 136 between the coated-aluminum wire 108 and the semiconductor die 106 to be a substantially homogeneous, aluminum-to-aluminum bond, while simultaneously allowing the second bond 138 between the coated-aluminum wire 108 and the bond site 116 to be a substantially homogeneous, palladium-to-palladium. Homogeneous, metallic bonds, such as the aluminum-to-aluminum first bond 136 and the palladium-to-palladium second bond 138, reduce the risk of bond pad cracking or lifting of the wire from the bond pad due to high bonding stresses, increases reliability and the life of the bond, and increases efficiency of current and heat transfer between the wire and the bond pad when compared to heterogeneous, intermetallic bonds.

Figure 2A:
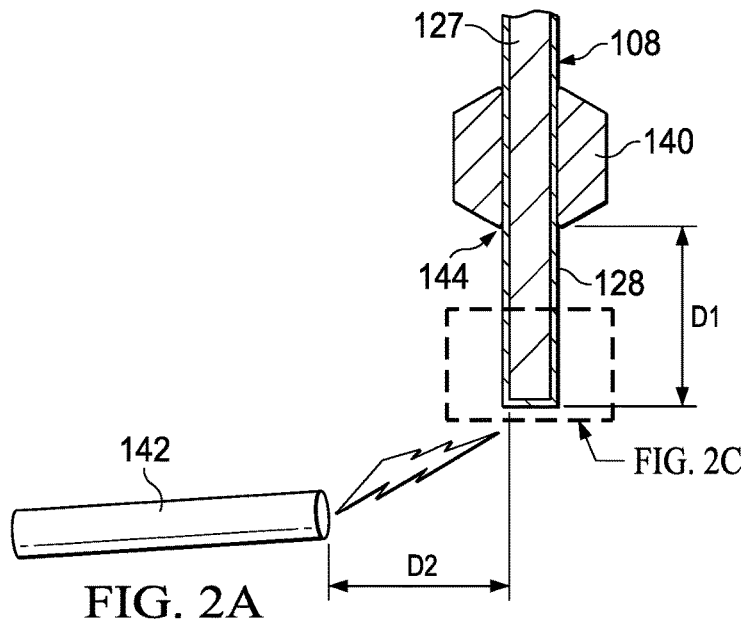
FIGS. 2A through 2B are schematic, cross-sectional diagrams representing formation of a free air ball in a wire bonding process.
Figure 2B:
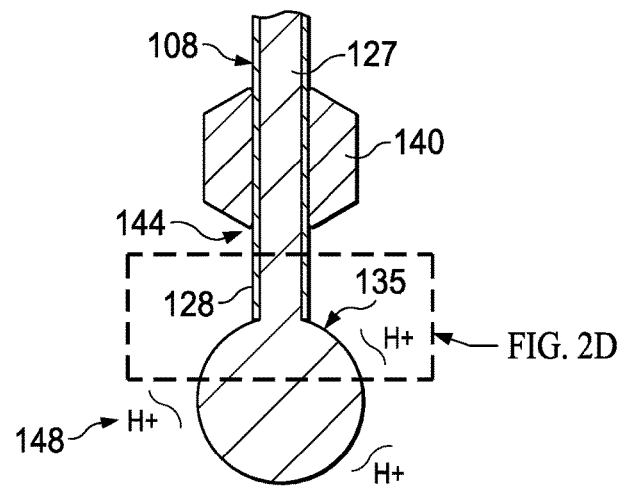
Figure 2C:
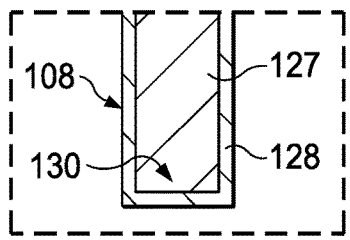
FIG. 2C is a schematic, detailed view of a portion of FIG. 2A.
Figure 2D:
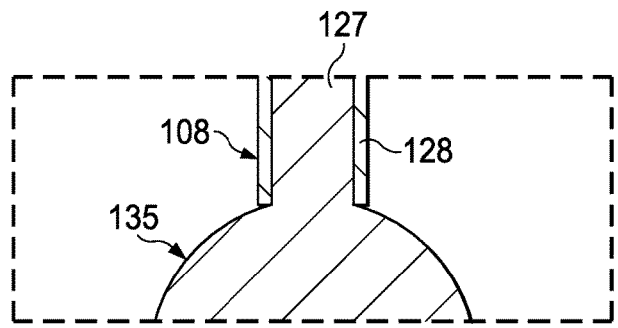
FIG. 2D is a schematic, detailed view of a portion of FIG. 2B.

Referring now to FIGS. 2A though 2D, schematic diagrams for forming a free air ball 135 in a wire ball bonding process is presented. The first end 130 of the coated-aluminum wire 108 is fed through a capillary 140 until the coated-aluminum wire 108 extends a distance D1 beyond a tip 144 of the capillary 140 (FIG. 2A). In some aspects, the diameter of the coated-aluminum wire 108 is between approximately 0.7 and 1.3 μm. In yet some aspects, the distance D1 that the coated-aluminum wire 108 extends beyond the tip 144 of the capillary 140 may be between 8 and 15 mils. In some aspects, the diameter of the free air ball 134 is approximately 50 μm.

Once a sufficient amount of the coated-aluminum wire 108 extends beyond the tip 144 of the capillary 140, an electrical flame-off (EFO) wand 142 is applied to the first end 138 of the coated-aluminum wire 108 to form the free air ball 135. During formation of the free air ball 135, the aluminum core 127 is exposed by removing the palladium coating 128. That is, in some aspects, the palladium coating 128 is removed or otherwise moved away from the first end 130 during formation of the free air ball. The palladium coating 128 is there in the first instance to protect the aluminum core 127 from absorbing hydronium ($H^+$) 148, becoming brittle, oxidizing or otherwise degrading during formation of the free air ball 135 in the wire ball bonding process. The hydronium 148 exist in air and when absorbed by aluminum may create voids in the aluminum. FIG. 2B illustrates the lack of absorption of the hydronium 148 by the free air ball 135 and, thus, a lack of voids in the free air ball 135 that may otherwise be present if the coating 128 was not present to protect the aluminum core 127.

The free air ball 134 is formed from the coated-aluminum wire's 108 aluminum core 127. The electrical flame-off wand 142 is used to remove or otherwise move the palladium coating 128 away from the first end 130 of the coated-aluminum wire 108 so that when the free air ball 134 is formed, at least a portion of the free air ball 134 is formed substantially of aluminum. In some aspects, the palladium coating 128 is removed or otherwise moved away from the first end 130 during formation of the free air ball 134. With the free air ball 134 formed substantially of aluminum, the first bond 136 between the free air ball 134 and the first bond pad 114 is a homogeneous, aluminum-to-aluminum bond (the first bond 136 is shown in FIG. 1A).

The electrical flame-off wand 142 may subject the coated-aluminum wire 108 to a higher current than typically used in free air ball formation. In some aspects, the electrical flame-off wand 142 emits an EFO current between approximately 150 and 170 mAmps. In yet some aspects, the EFO current is approximately 160 mAmps. In some aspects, an EFO gap D2 between the electrical flame-off wand 142 and the first end 130 of the coated-aluminum wire 108 is between approximately 20 and 30 mils. In yet some aspects, the EFO gap D2 is approximately 25 mils. In some aspects, the electrical flame-off wand 142 has an EFO fire time between approximately 900 and 1000 µs. The formation of the free air ball 134 may, in some aspects, be performed in an inert atmosphere to help prevent the aluminum from oxidizing. In a nonlimiting embodiment, the inert atmosphere may be comprised of approximately 95 percent nitrogen and 5 percent hydrogen. In yet some aspects, the inert atmosphere may be 100 percent nitrogen.

Figure 3:
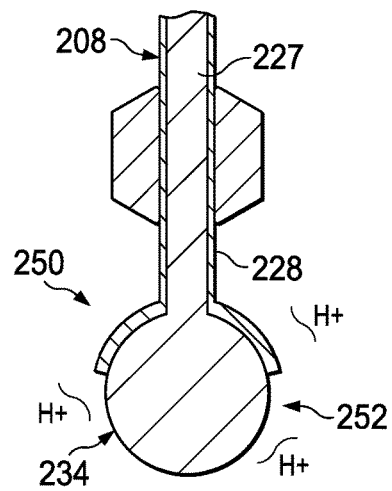
FIG. 3 is a schematic, partial cross-sectional view of a free air ball in a wire bonding process, according to an illustrative embodiment.

FIG. 3 is a schematic, partial cross-sectional view of a free air ball 234 in a wire bonding process, according to an illustrative embodiment. The free air ball 234 is similar to the free air ball 134 represented in FIG. 2B except that a first portion 250 of the free air ball 234 maintains at least some of a palladium coating 228. In some aspects, the first portion 250 of the free air ball 234 has more of the palladium coating 228 than a second portion 252 of the free air ball 234. In yet some aspects, the palladium coating 228 may be thicker over the first portion 250 of the free air ball 234 than over on aluminum core 227 of the coated-aluminum wire 208. In another aspect, the palladium coating 228 may be the same thickness over the first portion 250 of the free air ball 234 as over the aluminum core 227 of the coated-aluminum wire 208. In an illustrative embodiment, the second portion 252 of the free air ball 234 is free of the palladium coating 228. The free air ball 234 may be formed using the same processes and parameters as described above with reference to FIGS. 2A through 2D.

Figure 4:
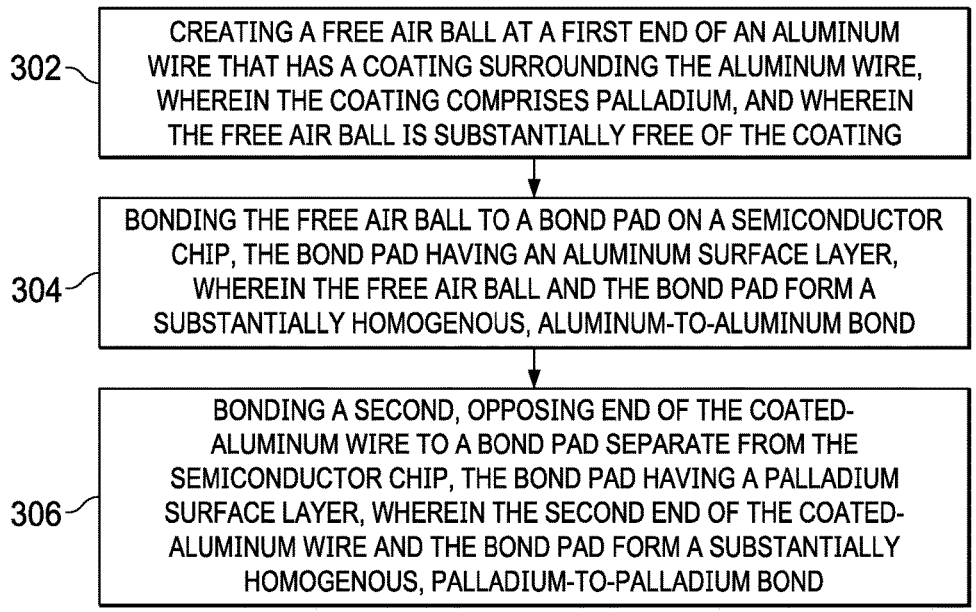
FIG. 4 is a flowchart for a method of interconnecting components of a semiconductor device using wire ball bonding, according to an illustrative embodiment.

FIG. 4 is a flowchart for a method of interconnecting components of a semiconductor device using wire ball bonding, according to an illustrative embodiment. At step 302, the free air ball 134 is created at the first end 130 of the aluminum wire 108 that has the coating 128 surrounding the aluminum wire 108. The coating 128 comprises palladium. The free air ball 134 is formed substantially free of the coating 128 and, hence, substantially free of palladium. At step 304, the free air ball 134 is bonded to the first bond pad 114 on the semiconductor die 106. The first bond pad 114 includes the aluminum surface layer 118. The free air ball 134 and the first bond pad 114 form a first bond 136 that is a substantially homogeneous, aluminum-to-aluminum bond. At step 306, the second end 132 of the coated-aluminum wire 108, which is coated with palladium, is bonded to a bond site 116, by way of a stitch bond or wedge bond, that is separate from the semiconductor die 106. The bond site 116 includes the palladium surface layer 122. The second end 132 of the coated-aluminum wire 108 and the bond site 116 form a second bond 138 that is a substantially homogeneous, palladium-to-palladium bond.

Figure 5:
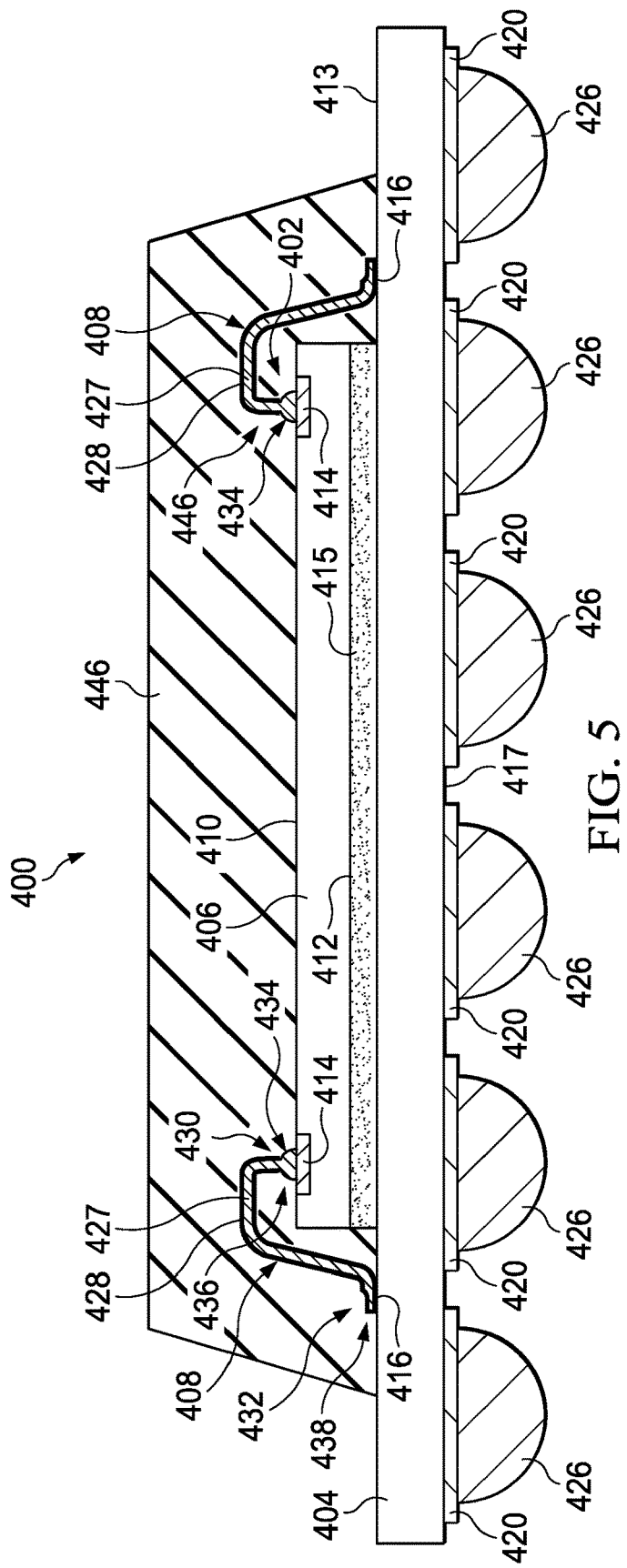
FIG. 5 is a schematic, cross-sectional view of a wire bond in a semiconductor device, according to an illustrative embodiment.

FIG. 5 is a schematic, cross-sectional view of a semiconductor device 400 using a wire ball bond 402, according to an illustrative embodiment. The semiconductor device 400 includes an electrically insulating substrate 404, a semiconductor chip 406 supported thereon, and a coated-aluminum wire 408 for electrically connecting the semiconductor chip 406 and a device external to the semiconductor chip 406, such as a bond pad (e.g., one of a second plurality of contact pads 416 introduced below). It should be noted that for clarity not all aspects of the semiconductor device 400 are shown, e.g., vias in the insulating substrate 404 are not shown.

The semiconductor chip 406 has an active surface 410 and a passive surface 412 with the passive surface 412 attached to a first surface 413 of the substrate 404 using an adhesive layer 415. The active surface 410 includes an integrated circuit and a first plurality of contact pads 414 comprising at least an aluminum or aluminum alloy surface layer.

The coated-aluminum wire 408 connects the first plurality of contact pads 414 on the semiconductor chip 306 to the second plurality of contact pads 416. The second plurality of contact pads 416 is on the first surface 413 of the substrate 404 laterally adjacent to the semiconductor chip 406. The second plurality of contact pads 416 include at least a palladium surface layer.

The coated-aluminum wire 408 includes an aluminum core 427 surrounded by a palladium coating 428. In some aspects, the palladium coating 428 may further include copper. The coated-aluminum wire 408 has a first end 430 and an opposing, second end 432. The first end 430 is bonded to the first plurality of contact pads 414 on the semiconductor chip 406 and the second end 432 is bonded to the second plurality of contact pads 416.

In each instance, an aluminum, free air ball (FAB) 434 formed on the first end 430 of the coated-aluminum wire 408 is attached to one of the first plurality of contact pads 414. During the formation of the aluminum, free air ball 434, the palladium coating 428 is removed such that the aluminum, free air ball 434 is formed from a portion of the aluminum core 427. A first bond 436 is formed between the aluminum, free air ball 434 and the aluminum surface layer of the first plurality of contact pads and is a substantially homogeneous, aluminum-to-aluminum bond. The process of removing the coating 428 and forming the free air ball 434 is similar to the process described above with reference to FIGS. 2A through 2D.

The second end 432 of the coated-aluminum wire 412 is bonded to the palladium surface layer of the second plurality of contact pads 416 to form a second bond 428 that is a substantially homogeneous, palladium-to-palladium bond. The palladium-to-palladium bond is formed in a manner analogous to that described in connection with FIG. 1C. In some aspects, the second bond 438 is a stitch bond. The semiconductor device 400, provides a coated-aluminum wire 408 that allows for a substantially homogeneous, aluminum-to-aluminum first bond 436 between the coated-aluminum wire 408 and the semiconductor chip 406, while simultaneously allowing for a substantially homogeneous, palladium-to-palladium second bond 438 between the coated-aluminum wire 408 and the second plurality of contact pads 416.

In some aspects, the substrate 404 includes a third plurality of contact pads 420 disposed on a second surface 417 of the substrate. In yet some aspects, a plurality of interconnection elements 426 is connected to the third plurality of contact pads 420. A molding compound 446 may cover at least a portion of the semiconductor chip 406, the coated-aluminum wire 408, the first bond 436 and the second bond 438.

It should be appreciated that the semiconductor device may be one of many semiconductor devices formed on a wafer. It should also be appreciated that the semiconductor device may be referred to as a semiconductor package or an individual semiconductor package when the semiconductor device has been singulated or separated from the wafer. The semiconductor device or semiconductor package may be singulated or separated by sawing the wafer along scribe lines on the wafer. The scribe lines being between adjacent devices on the wafer.

In one aspect, the semiconductor chip or die is attached to the lead frame. The attachment may be accomplished by attaching the silicon die or chip to a lead frame or other substrate using an adhesive, conductive adhesive or solder paste, solder wire, solder preforms, or other technique. In one aspect, the substantially homogenous, aluminum-to-aluminum ball bond and the substantially homogenous, palladium-to-palladium bond are covered with a molding or covering compound. The molding compound may be any suitable covering compound, e.g., epoxy resin filled with a silica filler.

It should be appreciated that the wire ball bonding technique described herein may be used for various configurations. A couple of nonlimiting examples of how the wire ball bonding technique may be used include interconnections of a semiconductor die to a lead frame, a semiconductor die to a substrate, and even of one semiconductor die in another semiconductor die.

Modifications are possible in the described embodiments, and other embodiments are possible, within the scope of the claims.

What is claimed is:

1. A method of interconnecting components of a semiconductor device using wire bonding, the method comprising:
    providing a coated-aluminum wire, the coated-aluminum wire having a coating that comprises palladium;
    forming a free air ball from a first end of the coated-aluminum wire, wherein during the formation of the free air ball, the coating is removed from at least a portion of the free air ball;
    bonding the free air ball to a bond pad on a semiconductor chip, the bond pad having an aluminum surface layer, wherein the free air ball and the aluminum surface layer of the bond pad form a substantially homogenous, aluminum-to-aluminum ball bond; and
    bonding a second, opposing end of the coated-aluminum wire to a lead on a lead frame, the lead having a palladium surface layer, wherein the second end of the coated-aluminum wire and the lead form a substantially homogenous, palladium-to-palladium bond.

2. The method of claim 1, wherein the coating prevents oxidation of the free air ball during formation of the free air ball.

3. The method of claim 1, wherein the substantially homogenous, palladium-to-palladium bond is a stitch bond.

4. The method of claim 1, wherein the free air ball is created using an electrical flame-off wand.

5. The method of claim 4, wherein the electrical flame-off wand uses a current in the range of 150 to 170 mAmps.

6. The method of claim 1, further comprising:
    attaching the semiconductor chip to the lead frame;
    covering the substantially homogenous, aluminum-to-aluminum ball bond and the substantially homogenous, palladium-to-palladium bond with a molding compound; and
    separating the semiconductor chip and the lead frame into an individual semiconductor package.

7. A semiconductor device comprising:
    a lead frame;
    a semiconductor die having a first side and an opposing, second side, the second side of the semiconductor die attached to the lead frame, the semiconductor die having an aluminum bond pad on the first side;
    a lead of the lead frame adjacent the semiconductor die, the lead having a palladium surface layer; and
    a palladium-coated aluminum interconnect wire having a first end and an opposing, second end;
    a ball bond between the bond pad and the first end of the palladium-coated aluminum interconnect wire, the ball bond being a substantially homogeneous, aluminum-to-aluminum ball bond; and
    a bond between the lead and the second end of the palladium coated-aluminum wire, the bond between the lead and the second end of the palladium coated-aluminum wire being a substantially homogeneous, palladium-to-palladium bond.

8. The device of claim 7, wherein the palladium-coated aluminum interconnect wire further comprises copper to form a palladium-copper coating.

9. The device of claim 7, wherein the bond between the lead and the second end of the palladium coated-aluminum wire is a stitch bond.

10. The device of claim 7, wherein the ball bond is substantially free of palladium.

11. The device of claim 7, wherein a first portion of the ball bond has more palladium coating than a second portion of the ball bond.

12. The device of claim 7 further comprising an insulating cover over the substantially homogeneous, aluminum-to-aluminum ball bond and the palladium-to-palladium bond.

13. The device of claim 7, wherein the substantially homogeneous, aluminum-to-aluminum ball bond is substantially free of oxidation.

14. A semiconductor device comprising:
    a support structure;
    a semiconductor die attached to the support structure, the semiconductor die having a bond pad on the semiconductor die, the bond pad having an aluminum surface layer;
    a bond site adjacent to the semiconductor die, the bond site having a palladium surface layer; and
    a coated-aluminum wire for connecting the bond pad on the semiconductor die to the bond site, the coated-aluminum wire having an aluminum core and a coating comprising palladium, the coated-aluminum wire having a first end substantially free of the coating and a second, opposing end;
    a substantially aluminum-to-aluminum ball bond, the substantially aluminum-to-aluminum ball bond formed between the first end of the coated-aluminum and the aluminum surface layer of the bond pad; and a palladium-to-palladium bond, the palladium-to-palladium bond between the second end of the coated-aluminum wire and the palladium surface layer of the bond site.

15. The device of claim 14, wherein the support structure is a semiconductor substrate.

16. The device of claim 14 further comprising a covering that covers the aluminum-to-aluminum bond and the palladium-to-palladium bond.

17. The device of claim 14, wherein the coating of the coated-aluminum wire further comprises copper.

18. The device of claim 14, wherein the palladium-to-palladium bond is a stitch bond.

19. The device of claim 14, wherein the first bond pad on the semiconductor die is above the bond site on the surface of the support structure.

20. The device of claim 14, wherein the wherein the support structure is a lead frame and the bond site is a lead of the lead frame.

* * * * *